United States Patent
Kobayashi

(10) Patent No.: US 8,111,728 B2
(45) Date of Patent: Feb. 7, 2012

(54) SEMICONDUCTOR LASER AND MANUFACTURING PROCESS THEREOF

(75) Inventor: Masahide Kobayashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/618,277

(22) Filed: Nov. 13, 2009

(65) Prior Publication Data
US 2010/0124245 A1 May 20, 2010

(30) Foreign Application Priority Data
Nov. 17, 2008 (JP) .................. 2008-293777

(51) Int. Cl.
*H01S 5/00* (2006.01)

(52) U.S. Cl. ............................... 372/46.01
(58) Field of Classification Search .............. 372/46.01
See application file for complete search history.

(56) References Cited

U.S. PATENT DOCUMENTS 6,002,701 A * 12/1999 Kan et al. .............. 372/46.01
7,684,456 B2 * 3/2010 Jikutani .................. 372/50.11
2006/0203865 A1 * 9/2006 Bour et al. ............... 372/43.01

FOREIGN PATENT DOCUMENTS

JP 04-154184 A 5/1992
JP 09-181389 A 7/1997

* cited by examiner

*Primary Examiner* — Patrick Stafford
(74) *Attorney, Agent, or Firm* — Sughrue Mion, PLLC

(57) ABSTRACT

A semiconductor laser has a semiconductor substrate, a lower cladding layer formed on the semiconductor substrate, an active layer disposed above the lower cladding layer, a first upper cladding layer disposed above the active layer, a second upper cladding layer disposed above the first upper cladding layer and having a mesa structure, a high-order mode filter layer formed on both side faces of the second upper cladding layer, continuously extending from the both side faces onto at least a part of a side region on both sides of the second upper cladding layer and having a band gap not exceeding a band gap of the active layer, and a block layer formed on the high-order mode filter layer and on a side region on both sides of the second upper cladding layer and including a layer having a band gap greater than a band gap of the active layer.

9 Claims, 13 Drawing Sheets

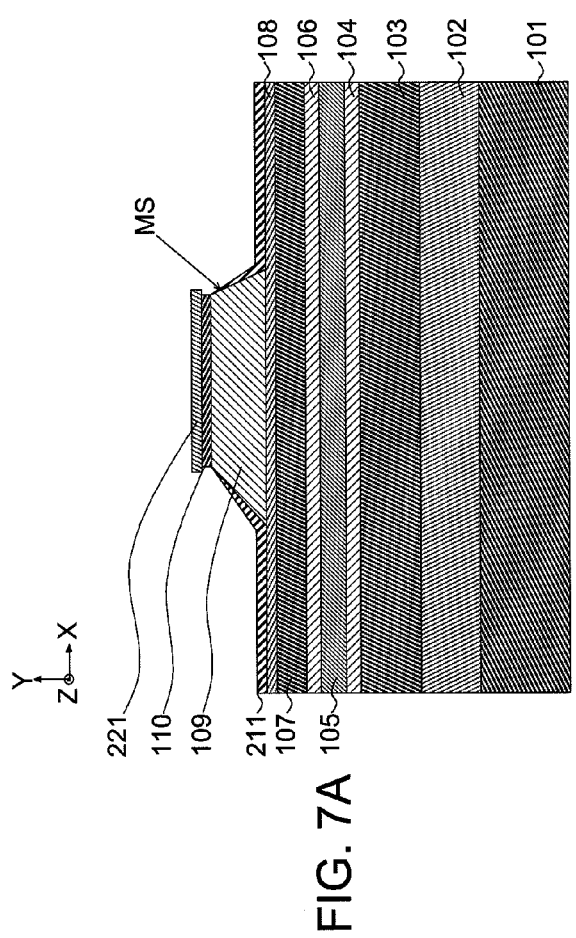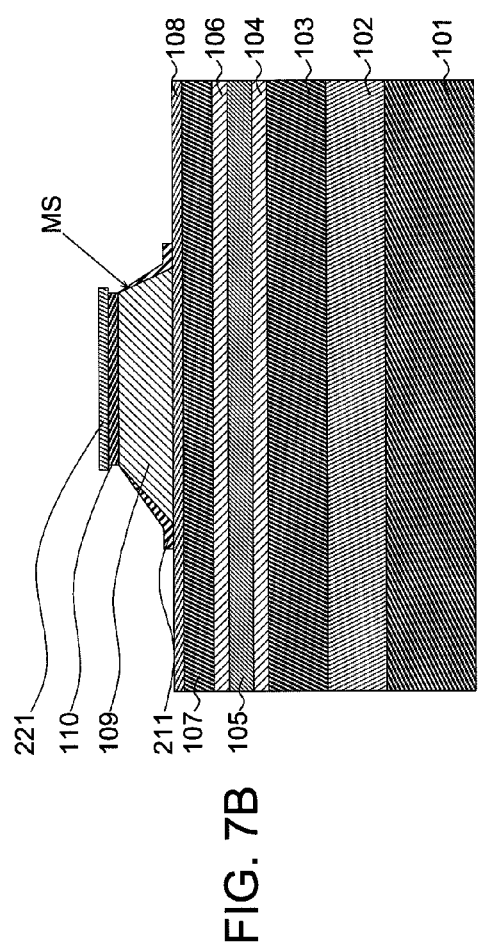
FIG. 7A
FIG. 7B

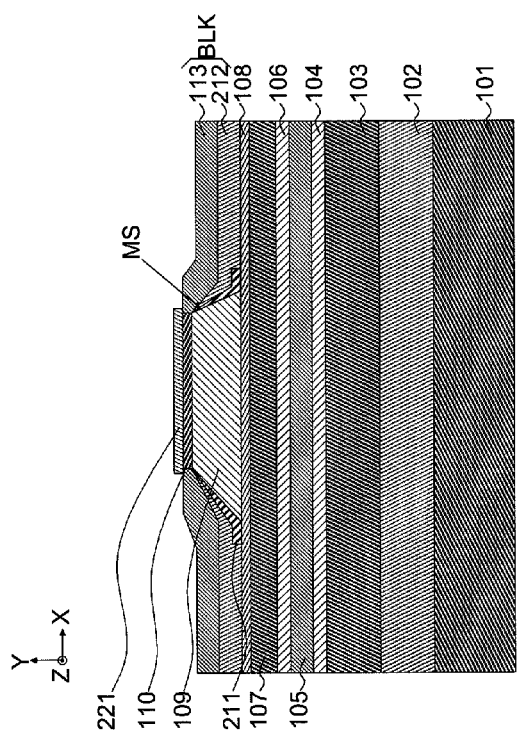
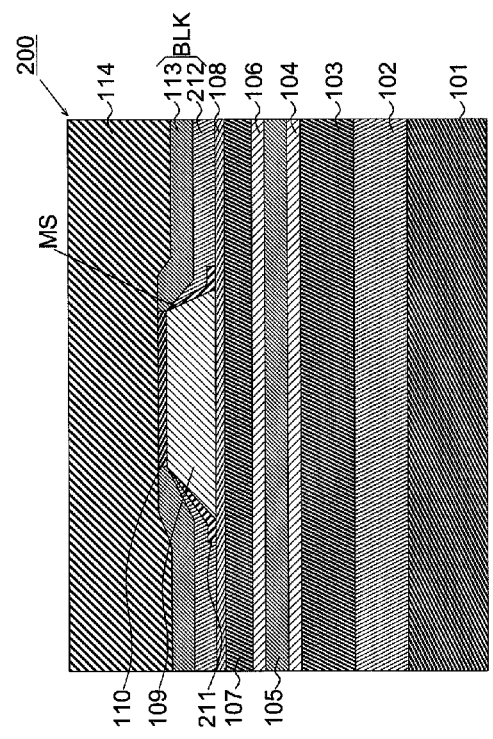
FIG. 8A
FIG. 8B

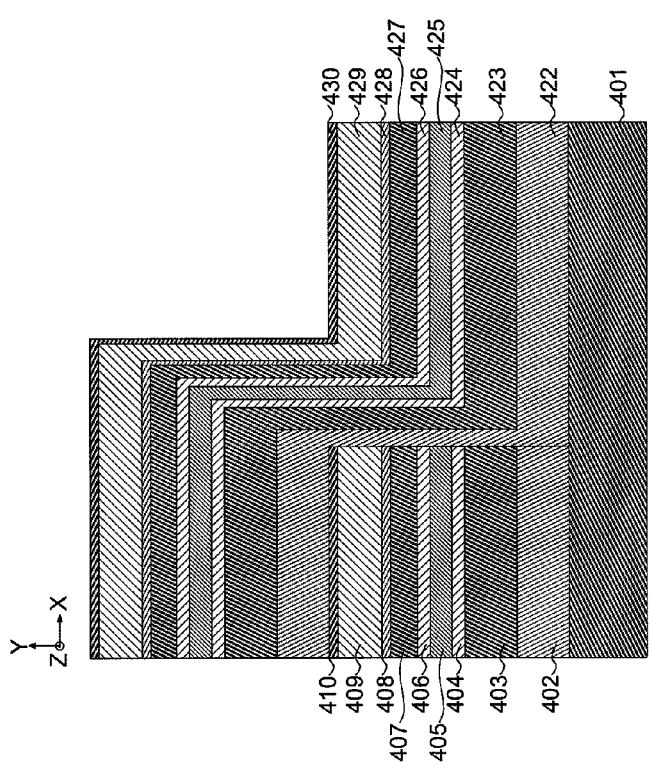
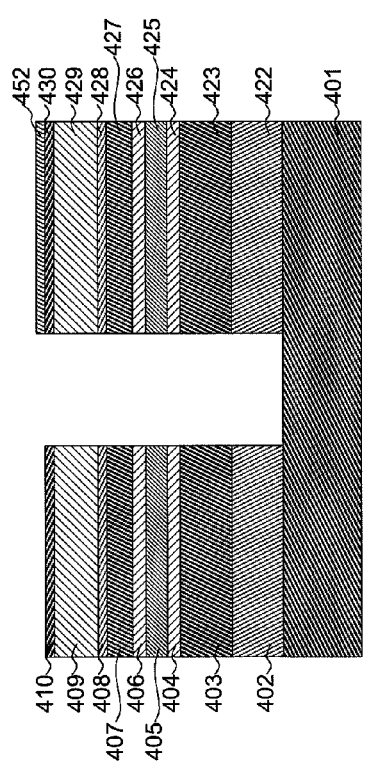
FIG. 10A
FIG. 10B

SEMICONDUCTOR LASER AND MANUFACTURING PROCESS THEREOF

TECHNICAL FIELD

This application is based upon and claims the benefit of the priority of Japanese patent application No. 2008-293777, filed on Nov. 17, 2008, the disclosure of which is incorporated herein in its entirety by reference thereto.

The present invention relates to a semiconductor laser and manufacturing process thereof. The present invention relates to a self-pulsating semiconductor laser and manufacturing process thereof.

BACKGROUND

A semiconductor laser is used as a light source in an optoelectronics field such as an optical disc device, optical fiber communication, laser printer and optical measuring. The optical disc device which uses a compact disc or digital versatile disc as a recording/playback medium, for example, brings out the feature of the semiconductor laser emitting light with the same wavelength and phase to read (play back) and write (record) data on/to the disc by the light converged to the wavelength size by a lens.

In the semiconductor laser for the playback, characteristics such as wavelength spectrum, far-field image in horizontal/vertical directions, noise, astigmatic difference, polarization and reliability in addition to warranty of actuation in a wide temperature range are required so as to satisfy specifications of an optical pickup head. In these characteristics, the noise characteristic is one of the important characteristics to determine the quality of the playback signal. As the main noises made in the semiconductor laser, in a longitudinal single mode actuation, there are modal competition noise caused by change in temperature and electrical current and optical regression noise caused by re-incidence of regression light from a laser end face. For the optical disc device, suppression of the optical regression noise is especially important because reflections from the optical disc and collimator lens generate the regression light.

In order to decrease the optical regression noise, it is required to weaken coherence of the laser by changing the longitudinal mode to a multi-mode and making the wavelength chirping by causing variation of refraction index in an active layer. As a method for this purpose, it is known that the laser is oscillated at high speed pulses to a current lower than an oscillation threshold by superposing a high-frequency current of hundreds MHz to several GHz on a direct current for driving the laser. According to this method, a high-frequency oscillator which is separately necessary increases the cost. The high-frequency current also generates EMI (Electro-Magnetic Interference). If parts for countermeasure against the EMI are provided, the cost is further increased.

On the other hand, as another art to suppress the optical regression noise, there is a method using "a self-pulsating semiconductor laser". In the self-pulsating semiconductor laser, a region referred to as "a saturable absorber" is provided around an active layer. The saturable absorber which has a switchable function between absorption and transmission of the laser causes variation in the refractive index in the active layer because the amount of optical loss in the saturable absorber is linked to the change in the number of carriers in the active layer. The variation of the refractive index in the active layer is an important factor for the generation of the wavelength chirping and changes difference $\Delta n$ between the refractive indexes inside and outside, with respect to a direction a parallel to a joint surface of the diode, of a waveguide in a direction vertical to the axial direction of a resonator. A series of actuations automatically takes place in the semiconductor device driven by the direct current, the intensity of the laser automatically changes in the frequency range from hundreds MHz to several GHz, and therefore the same effect as the superposition of the high-frequency current can be obtained in a single element.

The self-pulsating semiconductor laser is disclosed in Patent Documents 1 and 2, for example.

The semiconductor laser described in Patent Document 1 has a double hetero-structure having an active layer of GaInP or AlGaInP on a GaAs substrate of a first conductive type and cladding layers of AlGaInP which are provided on both sides of the active layer and have a refractive index lower than that of the active layer. The cladding layer of a second conductive type over the active layer has a mesa structure on the top surface of the active layer. The semiconductor laser has a $(Al_xGa_{1-x})_{0.5}In_{0.5}P$ layer of the second conductive type on the side faces of the mesa structure and on the top surface of the active layer on both sides of the mesa structure and further has a GaAs layer on the $(Al_xGa_{1-x})_{0.5}In_{0.5}P$ layer of the second conductive type.

The self-pulsating semiconductor laser described in Patent Document 2 has a semiconductor substrate of a first conductive type and a multilayered structure including an active layer and provided on the semiconductor substrate. The multilayered structure includes a first cladding layer of the first conductive type provided under the active layer, a second cladding layer of a second conductive type having a striped ridge portion and provided above the active layer, and a saturable absorbing film provided on the second cladding layer, the saturable absorbing film having an accumulation region for accumulating photoexcited carriers, the accumulation region being provided apart from a surface of the second cladding layer.

[Patent Document 1]
JP Patent Kokai Publication No. JP-A-04-154184
[Patent Document 2]
JP Patent Kokai Publication No. JP-A-09-181389

SUMMARY

The entire disclosures of Patent Documents 1 and 2 are incorporated herein by reference thereto.

The following analysis will be given based on a point of view of the present invention.

The present invention focuses on "stability of a horizontal transverse mode" in the self-pulsating semiconductor laser. The intensity of the self-pulsating oscillation depends on the volume of the formed saturable absorber. In the self-pulsating semiconductor laser having the saturable absorber on both sides of the active layer in the direction vertical to the axial direction of the resonator and parallel to the joint surface of the diode (referred to as "a horizontal direction" below), an overlap between distribution of optical intensity in the horizontal direction determined by the difference between equivalent refractive indexes inside and outside the waveguide with respect to the horizontal direction (referred to as "$\Delta n$" below) and distribution of injected current to the active layer in the horizontal direction is one of important factors to determine the volume of the saturable absorber. In addition, as a result of gain and loss of the active layer determined by the structure of the active layer and the structure of the waveguide, for example, an actuation point of the self-pulsating actuation on a gain curve (J-G curve) is also one of the important factors to determine the volume of the saturable absorber.

In the semiconductor laser, however, as optical output increases, a phenomenon referred to as spatial hole-burning generally occurs, in which induced emission locally decreases the density of the carriers centering at a position having spatially high optical density. In the self-pulsating semiconductor laser, because of a design of heavy optical confinement to the active region in a direction vertical to the axial direction of the resonator and vertical to the joint surface of the diode (referred to as "a vertical direction" below), the conspicuous influence of the spatial hole-burning increases the instability of the horizontal transverse mode. The instability of the horizontal transverse mode means that the ratio of the fundamental horizontal transverse mode in the distribution of the optical intensity in the horizontal direction decreases, the ratio of the high-order horizontal transverse mode increasing, the symmetry of the distribution of the optical intensity in the horizontal direction changing, a net gain decreasing. The instability of the horizontal transverse mode causes a problem that the volume of the saturable absorber can not be stably maintained in the wide optical output range or wide temperature range and therefore that the intensity of the self-pulsating oscillation can not be stably maintained.

In the self-pulsating semiconductor laser described in Patent Document 1, there is no sufficient attention paid to the stability of the horizontal transverse mode. There is therefore a possibility that, even if a suitable self-pulsating oscillation is achieved in one optical output range or temperature range by stably maintaining the overlap between the distribution of the optical intensity in the horizontal direction and the distribution of the injected current to the active layer in the horizontal direction and the actuation point on a gain curve as specified in the design, the self-pulsating oscillation becomes weak or stops at another optical output or temperature. In the optical disc device, this is undesirable in view of the performance warranty of the product because the optical regression noise causes an error of the signal playback. The semiconductor laser used in the optical disc device needs a stable self-pulsating oscillation in the wide optical output range of 1.5 mW to 6.0 mW and further in the wide temperature range of −10° C. to 75° C. It is difficult that the self-pulsating semiconductor laser as described in Patent Document 1 achieves the stable self-pulsating oscillation in this wide optical output range or wide temperature range.

In the self-pulsating semiconductor laser having the saturable absorbing film on both sides of the mesa structure, as described in Patent Document 2, it is difficult that the amount of the optical confinement into the saturable absorbing layer (interaction with light) is made greater because the laser is relatively firmly confined in the active layer. As a result, the strong self-pulsating intensity can not be obtained, and therefore it is difficult that the stable self-pulsating actuation is achieved in a required environment (the optical output, temperature).

According to a first aspect of the present invention, there is provided a semiconductor laser comprising: a semiconductor substrate; a lower cladding layer disposed above the semiconductor substrate; an active layer disposed above the lower cladding layer; a first upper cladding layer disposed above the active layer; and a second upper cladding layer disposed above the first upper cladding layer and having a mesa structure. The semiconductor layer further comprises: a high-order mode filter layer formed on both side faces of the second upper cladding layer, continuously extending from the both side faces onto at least a part of a side region on both side regions of the second upper cladding layer and having a band gap not exceeding a band gap of the active layer; and a block layer formed on the high-order mode filter layer and on the side regions of both sides of the second upper cladding layer, the block layer including a layer having a band gap greater than the band gap of the active layer.

According to a second aspect of the present invention, there is a process of manufacturing a semiconductor laser, the process comprising: providing a semiconductor substrate; forming a lower cladding layer above the semiconductor substrate; forming an active layer above the lower cladding layer; forming a first upper cladding layer above the active layer; and forming a second upper cladding layer, which has a mesa structure, above the first upper cladding layer. The process further comprises: forming a high-order mode filter layer having a band gap not exceeding a band gap of the active layer so as to extend on both side faces of the second upper cladding layer and continuously extend from both side faces of the second upper cladding layer onto at least a part of a side region on both side regions of the second upper cladding layer; and forming a block layer, which includes a layer having a band gap lager than a band gap of the active layer, on the high-order mode filter layer and on a side region on both side regions of the second upper cladding layer.

The meritorious effects of the present invention are summarized as follows.

The present invention has at least one of the following effects.

In the semiconductor laser of the present invention, the block layer includes the layer having the band gap greater than that of the active layer, and therefore the optical absorption coefficient in a range of an oscillation wavelength is low. Therefore, the oscillation can be easily generated because the loss in the waveguide decreases. As a result, according to the present invention, a low threshold current, high slope efficiency and low actuation current can be realized. Even under a high temperature condition, the low threshold current can restrain the self-pulsating oscillation from weakening through insufficiency of the gain. The low threshold current and improved slope efficiency also enables to obtain a desired optical output at the lower actuation current. Further, the lowering of the actuation current can prolong the life of the element.

In the semiconductor laser, the high-order mode filter layer having the band gap smaller than that of the active layer is formed. Therefore, according to the present invention, instability of a horizontal transverse mode by the spatial hole-burning can be restrained because the loss of the horizontal transverse high-order mode increases than the loss of the horizontal transverse fundamental mode. The lowering of the ratio of the horizontal transverse high-order mode occupied in the optical intensity distribution in the horizontal direction can increase the stability of the optical intensity distribution in the horizontal direction and further suppress the lowering of the gain. As a result, the stable self-pulsating oscillation can be maintained in the wide optical output range and in the wide temperature range. Accordingly, the optical regression noise can be restrained efficiently, and therefore the reliability of the actuation of the semiconductor laser can be enhanced.

According to the process of manufacturing the semiconductor laser of the present invention, the semiconductor laser can be manufactured without exposing the surface of the active layer to the atmosphere. As a result, a dark defect in the active layer can be prevented from being formed. Accordingly, the self-pulsating oscillation can be restrained from weakening caused by the insufficiency of the gain of the active layer itself. The life of the element can be prolonged because the actuation current decreases.

BRIEF DESCRIPTIONS OF THE DRAWINGS

FIGS. 7A and 7B illustrate schematically flow charts to explain a process of manufacturing a semiconductor laser according to the second exemplary embodiment of the present invention.

FIGS. 8A and 8B illustrate schematically flow charts to explain a process of manufacturing a semiconductor laser according to the second exemplary embodiment of the present invention.

FIGS. 10A and 10B illustrate schematically flow charts to explain a process of manufacturing a semiconductor laser according to the fourth exemplary embodiment of the present invention.

PREFERRED MODES

Figure 1:
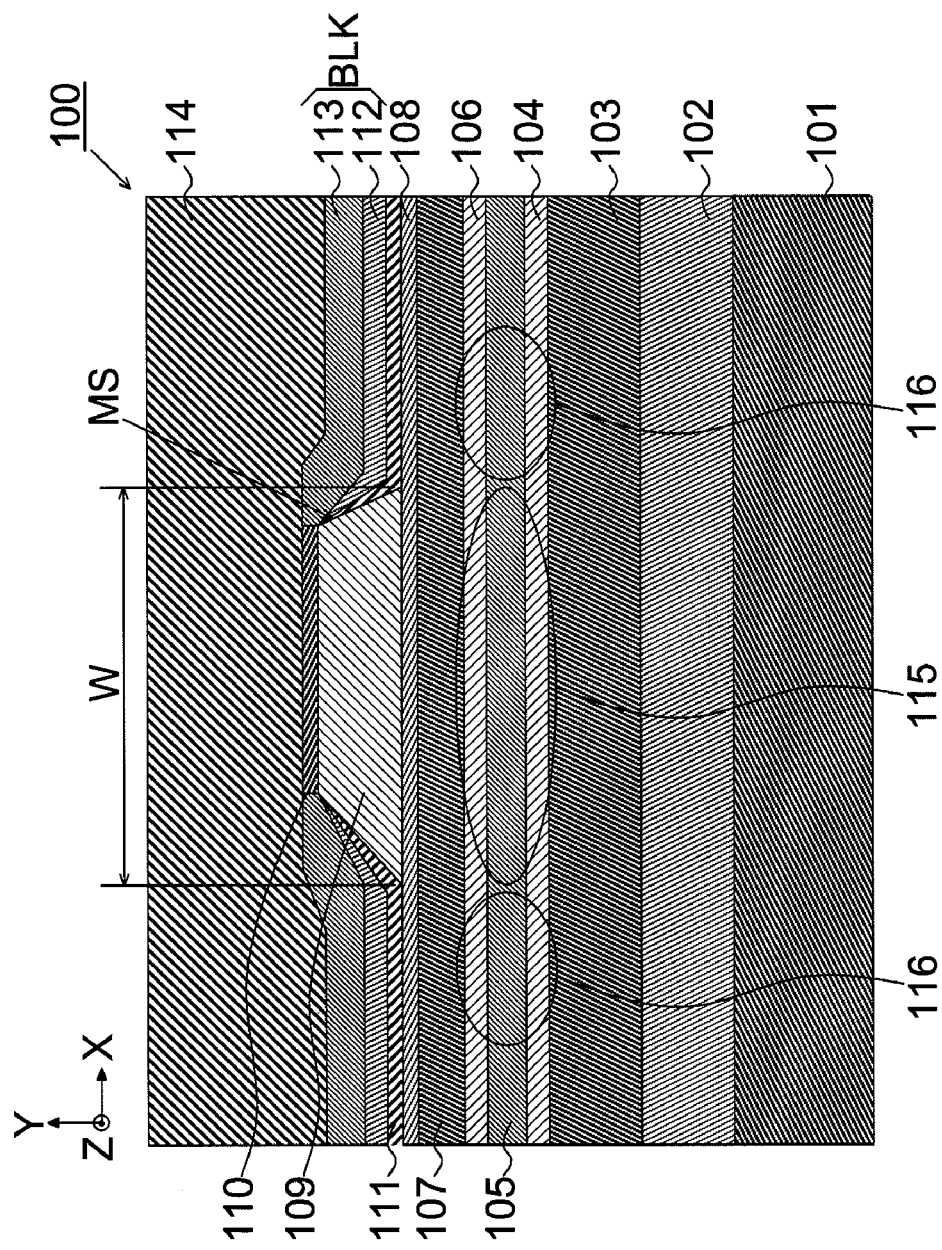
FIG. 1 illustrates a schematically cross-sectional view of a semiconductor laser according to a first exemplary embodiment of the present invention.

A semiconductor laser according to a first exemplary embodiment of the present invention will be explained below. FIG. 1 illustrates a schematically cross-sectional view of the semiconductor laser according to the first exemplary embodiment of the present invention. In FIG. 1, a Z direction means an axial direction of a resonator. An X direction (transverse direction) means a direction vertical to the axial direction of the resonator and parallel to a pn joint interface. A Y direction means a direction vertical to the axial direction of the resonator and vertical to the pn joint interface. Standing waves in the X, Y and Z direction are referred to as a horizontal transverse mode, vertical transverse mode, and longitudinal mode, respectively.

A semiconductor multilayered structure of a semiconductor 100 according to the first exemplary embodiment will be explained below. In an exemplary embodiment illustrated in FIG. 1, a buffer layer 102 of a first conductive type to enhance crystallinity is formed on a semiconductor substrate 101 of the first conductive type. A double heterostructure (DH) is formed on the buffer layer 102. To be concrete, an active layer 105 is formed on a lower cladding layer 103 of the first conductive type through (with intervention of) a lower guide layer 104. A first upper cladding layer 107 of a second conductive type is formed on the active layer 105 through an upper guide layer 106. A second upper cladding layer 109 of the second conductive type is formed on the first upper cladding layer 107 through an etching stopper layer 108. The second upper cladding layer 109 has "a mesa structure MS (ridge structure)" formed in a stripe manner along the Z direction. A high-order mode filter layer 111 is formed on both side faces of the second upper cladding layer 109 having the mesa structure MS and on the etching stopper layer 108 so as to continuously extend from both side faces of the second upper cladding layer 109 to both end faces of the laser 100. A block layer BLK is formed on the high-order mode filter layer 111. In the exemplary embodiment illustrated in FIG. 1, the block layer BLK has a lower block layer 112 and an upper block layer 113. An upper face of the second upper cladding layer 109 (mesa structure MS) is covered with a cap layer 110 of the second conductive type. A contact layer 114 of the second conductive type is formed on the cap layer 110 and block layer BLK.

In this exemplary embodiment, a band gap of the high-order mode filter layer 111 does not exceed a band gap of the active layer 105.

The block layer BLK serves to concentrate an injected current injected into the active layer on the mesa structure MS. The block layer BLK also serves to guide light in the X direction (horizontal transverse mode). In the present invention, the block layer BLK includes a layer having the band gap greater than that of the active layer 105. In the exemplary embodiment illustrated in FIG. 1, the lower block layer 112 has the band gap greater than that of the active layer 105.

The semiconductor buried layers 111-113 are formed on both sides of the mesa structure MS in order of a narrow gap/wide gap from below, relative to the band gap of the active layer 105. The narrow gap layer which contacts with the side faces of the mesa structure MS functions as the high-order mode filter layer 111.

An example of the multilayered structure of the semiconductor laser 100 according to the first exemplary embodiment will be explained below. In the following example(s), although the first conductive type is an n type, and the second conductive type is a p type, the n type and p type are exchangeable. $(Al_xGa_{1-x})_{0.5}In_{0.5}P$ may be expressed as AlGaInP. In this case, an Al composition x ($0 \leq x \leq 1$) is expressed in parentheses.

A first example of the multilayered structure of the semiconductor laser 100 of the present invention will be shown below.

Semiconductor Substrate 101: n Type GaAs

Buffer Layer 102: n Type GaAs; Thickness 650 nm; Impurity Concentration $6 \times 10^{17}$ cm$^{-3}$ Lower Cladding Layer 103: n Type AlGaInP (x=0.7); Thickness 1200 nm; Impurity Concentration $6 \times 10^{17}$ cm$^{-3}$ Lower Guide Layer 104: AlGaInP (x=0.50); Thickness 30 nm Active Layer 105 (Well Layer): GaInP; Thickness 5.0 nm Active Layer 105 (Barrier Layer): AlGaInP (x=0.50); Thickness 5.0 nm Upper Guide Layer 106: AlGaInP (x=0.50); Thickness 30 nm First Upper Cladding Layer 107: p Type AlGaInP (x=0.7); Thickness 200 nm; Impurity Concentration $6\times10^{17}$ cm$^{-3}$ Etching Stopper Layer 108: p Type GaInP; Thickness 10 nm; Impurity Concentration $6\times10^{17}$ cm$^{-3}$ Second Upper Cladding Layer 109: p Type AlGaInP (x=0.7); Thickness 1000 nm; Impurity Concentration $6\times10^{17}$ cm$^{-3}$; Width W of Bottom of Mesa Structure MS 3.5 μm Cap Layer 110: p Type GaAs; Thickness 300 nm; Impurity Concentration $1.5\times10^{18}$ cm$^{-3}$ High-Order Mode Filter Layer 111: n Type or Undoped GaAs Layer or GaInP Layer; Thickness 10 nm (on Etching Stopper Layer 108)

Block Layer BLK (Lower Block Layer 112): n Type or Undoped $(Al_xGa_{1-x})_{0.5}In_{0.5}P$ Layer (in case of x=1, AlInP Layer); Thickness 150 nm Block Layer BLK (Upper Block Layer 113): n Type GaAs Layer; Thickness 850 nm; Impurity Concentration $3\times10^{18}$ cm$^{-3}$ Contact Layer 114: p Type GaAs; Thickness 3000 nm; Impurity Concentration $2\times10^{18}$ cm$^{-3}$ In the above first example of the first exemplary embodiment, the band gap of the active layer 105 is smaller than those of the guide layer and cladding layer. The refractive index of the active layer 105 is greater than those of the guide layer and cladding layer. The active layer 105 has a multi-quantum well structure having multilayered quantum wells. The wells are separated by the barrier layer.

In the above first example of the first exemplary embodiment, the band gap of the high-order mode filter layer 111 is equal to or less than that of a light-emitting part of the active layer 105, and therefore the formed high-order mode filter layer 111 has a high optical absorption coefficient.

In the above first example of the first exemplary embodiment, the band gap of the lower block layer 112 is greater than that of the light-emitting part of the active layer 105, and therefore the formed block layer BLK has a low optical absorption coefficient.

An oscillation wavelength of the semiconductor laser 100 according to the above structure may be designed to a desired wavelength around about 650 nm, for example. The length of the element of the semiconductor laser may be designed to 350 μm, for example, and the width of the element may be designed to 250 μm, for example. A front end face (light emitting face) may be covered with a coating having a reflectance of about 20%, for example, and a back end face may be covered with a coating having a reflectance of about 70%, for example.

Next, a second example of the multilayered structure of the semiconductor laser 100 of the present invention will be shown below.

Semiconductor Substrate 101: n Type GaAs

Buffer Layer 102: n Type GaAs; Thickness 650 nm; Impurity Concentration $6\times10^{17}$ cm$^{-3}$ Lower Cladding Layer 103: n Type AlGaAs (x=0.5); Thickness 1200 nm; Impurity Concentration $1\times10^{18}$ cm$^{-3}$ Lower Guide Layer 104: AlGaAs (x=0.35); Thickness 80 nm Active Layer 105 (Well Layer): AlGaAs (x=0.05); Thickness 4.8 nm Active Layer 105 (Barrier Layer): AlGaAs (x=0.3); Thickness 5.0 nm Upper Guide Layer 106: AlGaAs (x=0.35); Thickness 80 nm First Upper Cladding Layer 107: p Type AlGaAs (x=0.5); Thickness 250 nm; Impurity Concentration $5\times10^{17}$ cm$^{-3}$ Etching Stopper Layer 108: p Type GaAs; Thickness 10 nm; Impurity Concentration $6\times10^{17}$ cm$^{-3}$ Second Upper Cladding Layer 109: p Type AlGaAs (x=0.5); Thickness 1000 nm; Impurity Concentration $6\times10^{17}$ cm$^{-3}$; Width W of Bottom of Mesa Structure MS 4.0 μm Cap Layer 110: p Type GaAs; Thickness 300 nm; Impurity Concentration $1.5\times10^{18}$ cm$^{-3}$ High-Order Mode Filter Layer 111: n Type or Undoped GaAs Layer or GaInP Layer; Thickness 10 nm (on Etching Stopper Layer 108), Width from Second Upper Cladding Layer 109: 100 nm Block Layer BLK (Lower Block Layer 112): n Type or Undoped $(Al_xGa_{1-x})_{0.5}In_{0.5}P$ Layer (in case of x=1, AlInP Layer); Thickness 150 nm, Block Layer BLK (Upper Block Layer 113): n Type GaAs Layer; Thickness 850 nm; Impurity Concentration $3\times10^{18}$ cm$^{-3}$ Contact Layer 114: p Type GaAs; Thickness 3000 nm; Impurity Concentration $2\times10^{18}$ cm$^{-3}$ In the above second example of the first exemplary embodiment, when the high-order mode filter layer 111 is the GaAs layer, the band gap of the high-order mode filter layer 111 is equal to or less than that of a light-emitting part of the active layer 105, and therefore the formed high-order mode filter layer 111 has a high optical absorption coefficient.

According to the second example, the effective refractive index Δn in the X direction is about $3.0\times10^{-3}$.

According to the first example, the semiconductor multilayered structure on the semiconductor substrate 101 may be formed of a material of the GaInP/AlGaInP type, and the oscillation wavelength may be designed to about 650 nm. According to the second example, the semiconductor multilayered structure may be formed of a material of the GaAs/AlGaInP type, and the oscillation wavelength may be designed to about 780 nm.

Next, based on the above first example and FIG. 1, the function and effect will be explained.

If forward bias is applied to the above double heterostructure, reverse bias is applied between the block layer BLK (n-GaAs Layer 113/n-ori-AlInP 112) and high-order mode filter layer (n-ori-GaAs layer 111) and the p type layer (p-GaInP layer 108/p-AlGaInP layer 107) under these layers. As a result, the current flows from only the second upper cladding layer 109 (mesa structure MS) into the first upper cladding layer 107 and active layer 105. Namely, the current is blocked by the block layer BLK and constricted to the mesa structure MS. In this sense, it may be said that the block layer BLK functions as "a current constriction mechanism".

The mesa structure MS is formed until the neighborhood of the active layer 105, and the width of the active layer 105 into which the current is injected almost corresponds to the width W of the bottom of the mesa structure MS. As described below, in more detail, the current is injected in a width extending in the X direction from the bottom of the mesa structure MS to the active layer 105. As a result, in the active layer 105, the gain is generated (the population inversion is formed) only in a region almost corresponding to the width W of the bottom of the mesa structure MS. This region is illustrated as a gain region (active region) 115 in FIG. 1.

Regarding the light guide, the optical confinement in the Y direction (vertical transverse mode) may be achieved by the above double heterostructure. On the other hand, in the optical confinement in the X direction (horizontal transverse mode), the light can not be completely confined in the active layer 105 and exudes to the outside. The exuding light is formed at the neighborhood of the active layer 105 and guided by, in the Y direction, the lower guide layer 104, upper guide layer 106, lower cladding layer 103, first upper cladding layer 107 and second upper cladding layer 109, which have the band gap greater than that of the active layer 105, and by, in the X direction, the high-order mode filter layer 111 having the higher absorption coefficient and the block layer BLK having the relatively lower absorption coefficient. In this sense, it may be said that the high-order mode filter layer 111 and block layer BLK also function as "an X direction optical guide mechanism".

The reason that the high-order mode filter layer 111 is formed not under but on the mesa structure MS is that the optical loss of the fundamental mode light is restrained from increasing and further that the optical loss of the high-order mode is effectively made increase. The reason that the high-order mode filter layer 111 is formed not apart from the both side faces of the mesa structure MS but adjacent to the mesa structure MS is also that the optical loss of the fundamental mode light is restrained from increasing and further that the optical loss of the high-order mode is effectively made increase.

Figure 2:
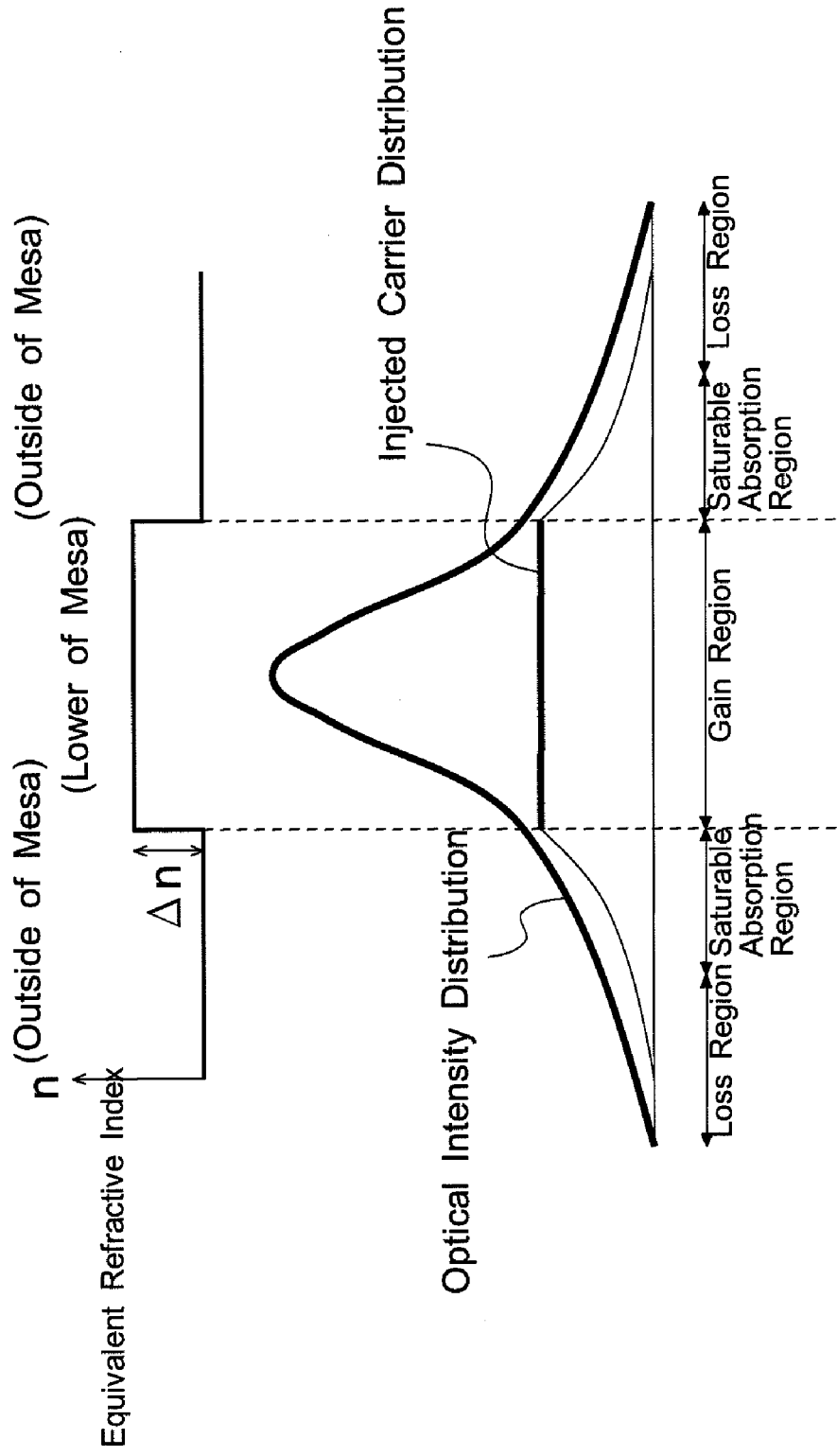
FIG. 2 illustrates a graph showing the relation between optical intensity distribution and injected carrier distribution around an active layer in a horizontal direction.

FIG. 2 illustrates a graph showing the relation between the optical intensity distribution and the injected carrier distribution in an area of the active layer and nearby in the horizontal direction. As illustrated in FIG. 2, in the active layer 105, the width of the optical guide region is greater than the width of the gain region 115 determined by the spread of the current injected into the active layer 105 in the X direction. The difference between the optical guide region and the gain region 115, namely, in the optical guide region outside the gain region 115, a part nearer to the gain region 115 functions as "a saturable absorber region 116" and the farther region becomes a loss region. This saturable absorber region realizes the self-pulsating oscillation. The intensity of the self-pulsating oscillation depends on the volume of the saturable absorber region 116. Although the volume which is capable of functioning as the saturable absorber region 116 is the difference between the optical guide region and the gain region 115, what ratio of this volume would perform the saturable absorption function also depends on the absolute value of the gain and the carrier's life in the saturable absorber region 116. The size of the optical guide region is determined basically by the difference Δn between the equivalent refractive index of the region corresponding to the mesa structure MS in the X direction and that of the other region(s).

On the other hand, the size of the gain region 115 corresponds basically to the width of the distribution of the current injected into the active layer 105 and, in more detail, the width of the distribution of the injected current depends not only on the width W of the bottom of the mesa structure MS but also on the temperature because the distribution of the injected current in the X direction depends on the temperature. Under a condition of higher temperature, the width of the distribution of the injected current becomes wider relatively. The reason is that the spread of the hole carriers in the X direction (sometimes referred to as "transverse spread" below) increases in the first upper cladding layer 107, upper guide layer 106 and active layer 105 just under the mesa structure MS. Accordingly, the gain region 115 becomes relatively greater, and the loss region capable of functioning as the saturable absorber region 116 becomes relatively smaller. Under a condition of lower temperature, conversely, the transverse spread of the injected current becomes smaller, and the gain region 115 also becomes relatively smaller. Accordingly, the loss region capable of functioning as the saturable absorber region 116 becomes relatively greater. On the other hand, as described above, as a result of the gain and loss of the active layer determined by, for example, the structure of the active layer and the structure of the waveguide, what actuation point on the gain curve (J-G curve) the self-pulsating actuates is also the important factor to determine the volume of the saturable absorber. Under the condition of the higher temperature, because the gain of the active layer itself is relatively smaller, and the injected carrier density required for the laser oscillation is relatively higher, there is generally a tendency to a smaller differential gain and greater gain saturation. Under the condition of the lower temperature, conversely, because the gain of the active layer itself is relatively greater, and the injected carrier density required for the laser oscillation is relatively lower, there is generally a tendency to a greater differential gain and smaller gain saturation. However, it heavily depends on the amount of the loss of the loss region capable of functioning as the saturable absorber region 116, which is determined by the difference between the optical guide region and the gain region 115 at each temperature.

The temperature changes the volume of the loss region capable of functioning as the saturable absorber region 116 and the gain curve and actuation point thereon. Accordingly, the self-pulsating oscillation depends on the temperature. Under the condition of the lower temperature, for example, if the volume of the loss region capable of functioning as the saturable absorber region 116 becomes too large, the self-pulsating actuation can not stably start from a low power range because of a shortage of the differential gain, or the self-pulsating oscillation becomes weaker because of the excess loss. However, if the gain of the active layer itself is too greater than the loss, the self-pulsating oscillation sometimes becomes weaker because of the excess gain. On the other hand, under the condition of the higher temperature, if the volume of the loss region capable of functioning as the saturable absorber region 116 becomes too small, the self-pulsating actuation becomes weaker because of the excess gain. Also there is a case where the gain of the active layer itself is too smaller than the loss, then the self-pulsating oscillation sometimes conversely becomes weaker because of the excess loss. If the self-pulsating oscillation becomes weak, the optical regression noise becomes conspicuous. In order to enhance the actuation reliability of the semiconductor laser, it is important to design the structure so as to maintain the stable self-pulsating oscillation in a wide temperature range (at least −10° C. to 75° C.) after due consideration of the temperature dependence. It is necessary to stably generate the oscillation itself for the stable self-pulsating oscillation. It is preferred that the loss is decreased as much as possible because the oscillation occurs under the condition that the gain by the induced emission exceeds the loss (absorption, dispersion, etc.).

In a semiconductor laser in which the block layer is made of only the GaAs layer having a property of absorbing light, for example, the loss in the waveguide increases, and therefore the laser oscillation is difficult to be generated. As a result, the threshold current increases, and the actuation current also increases. In the semiconductor laser having the active layer made of the material of the GaInP/AlGaInP type, especially, this problem becomes conspicuous because of the influence the carrier overflow which becomes conspicuous at the time of high temperature.

On the other hand, in the semiconductor laser of the present invention, the block layer BLK includes the lower block layer 112 (the AlInP layer or AlGaInP layer, for example) having a low optical absorption coefficient in the range of the oscillation wavelength. As compared with the semiconductor laser in which the block layer is made of only the GaAs layer having the property of absorbing light, the oscillation is easily generated due to lowering of the loss in the wavelength, and the threshold current is decreased. Although the threshold current has an increasing tendency with the rise of the temperature, the oscillation is restrained from being weakened through deficiency of the gain under the condition of the high temperature because the absolute value of the threshold current becomes enough low. The lowering of the threshold current and improvement of slope efficiency make it possible to obtain a desired optical output at the lower actuation current (see example 1). The life of the element can be also prolonged by the lowering of the actuation current.

For realizing the stable self-pulsating oscillation in the wide range of the optical output and in the wide range of the temperature, the stability of the transverse mode is very important in addition to the improvement of the oscillation property (threshold current, slope efficiency) as described above. In the self-pulsating semiconductor laser having the saturable absorber in the X direction like this exemplary embodiment, the stability of the horizontal transverse mode is especially important because the volume of the loss region capable of functioning as the saturable absorber region 116 is determined by the difference between the optical guide region and the gain region 115. A cause of the instability of the horizontal transverse mode is that the spatial hole-burning decreases the gain of the fundamental mode and makes it smaller the difference between the threshold gain of the fundamental mode and that of the high-order mode. As the ratio of the high-order mode occupied in the horizontal transverse mode increases, in the first-order mode, for example, the optical intensity increases around the flanks of the mesa structure MS (at the neighborhood of the outside of both side faces), and therefore the net distribution of the optical intensity in the horizontal direction gradually moves toward the flanks of the mesa structure MS. In this state, the difference between the optical guide region and the gain region 115 becomes instable, and this can not determine the volume of the loss region capable of functioning as the saturable absorber region 116. If the spatial hole-burning makes the transverse mode in the horizontal direction instable, the phenomenon of beam steering, in which the vertical mode in the Z direction meanders, occurs, and therefore the volume of the loss region capable of functioning as the saturable absorber region 116 can not be determined by the same reason. The instability of the transverse mode and vertical mode makes the gain curve (J-G curve) instable and can not also determine the actuation point of the self-pulsating actuation. The stability of the horizontal transverse mode in the wide range of the optical output and in the wide range of the temperature can make it stable the volume of the formed saturable absorber and therefore realize the stable self-pulsating oscillation.

In order to realize the self-pulsating oscillation in which the horizontal transverse mode is stable in the wide range of the optical output and in the wide range of the temperature, to say nothing of the restraint of the spatial hole-burning, it is effective that the difference between the threshold gain of the fundamental mode and that of the high-order mode in the horizontal transverse mode is kept large from just after start of the oscillation so that the difference does not become too small even if the spatial hole-burning occurs. In the distribution of the optical intensity in the mesa structure MS and at the flanks of the mesa structure, which is formed by the gain by the induced emission exceeding the loss and therefore having the optical gain, the fundamental mode has the strong optical intensity around the center of the mesa structure MS, whereas the high-order mode has the strong optical intensity around the flanks of the mesa structure MS.

According to this exemplary embodiment, the high-order mode filter layer 111 formed at least at the flanks of the mesa structure MS is formed of a layer having the high optical absorption coefficient in the range of the oscillation wavelength (the GaAs layer, for example). As a result, it is possible to keep the difference large between the threshold gain of the fundamental mode and that of the high-order mode in the horizontal transverse mode from just after start of the oscillation because the optical loss of the high-order mode in the high-order mode filter layer 111 increases than the optical loss of the fundamental mode in the high-order mode filter layer 111 (see example 2). The stable self-pulsating oscillation in the wide range of the optical output (1.5 mW to 6.0 mW, for example) and in the wide range of the temperature (−10° C. to 75° C., for example) can be realized without generating the instability of the horizontal direction (X direction) transverse mode and resonator direction (Z direction) vertical mode caused by the spatial hole-burning. According to the semiconductor laser of the present invention, the good signal playback is available in the actuation range required for the light source of the optical disc device. Enough restraint of the regression noise can enhance the reliability of the semiconductor laser.

According to this exemplary embodiment, the optical loss of the high-order mode can be increased by forming the high-order mode filter layer 111 on and adjacent to the mesa structure MS.

According to the semiconductor laser of the present invention, it is possible to suitably and stably balance "the loss by the saturable absorber layer" with "the gain of the active layer itself", which change with the temperature, in the wide range of the optical output and in the wide range of the temperature and to realize the stable self-pulsating oscillation. The element having good long-term reliability can be obtained because such oscillation property can be realized at the low threshold current and high slope efficiency. In the optical output dependency and temperature dependency of the self-pulsating intensity, reduced inplane unevenness and high reproducibility can be also achieved. It is further possible to keep a yield of the product high and stable to improve productivity.

Figure 3:
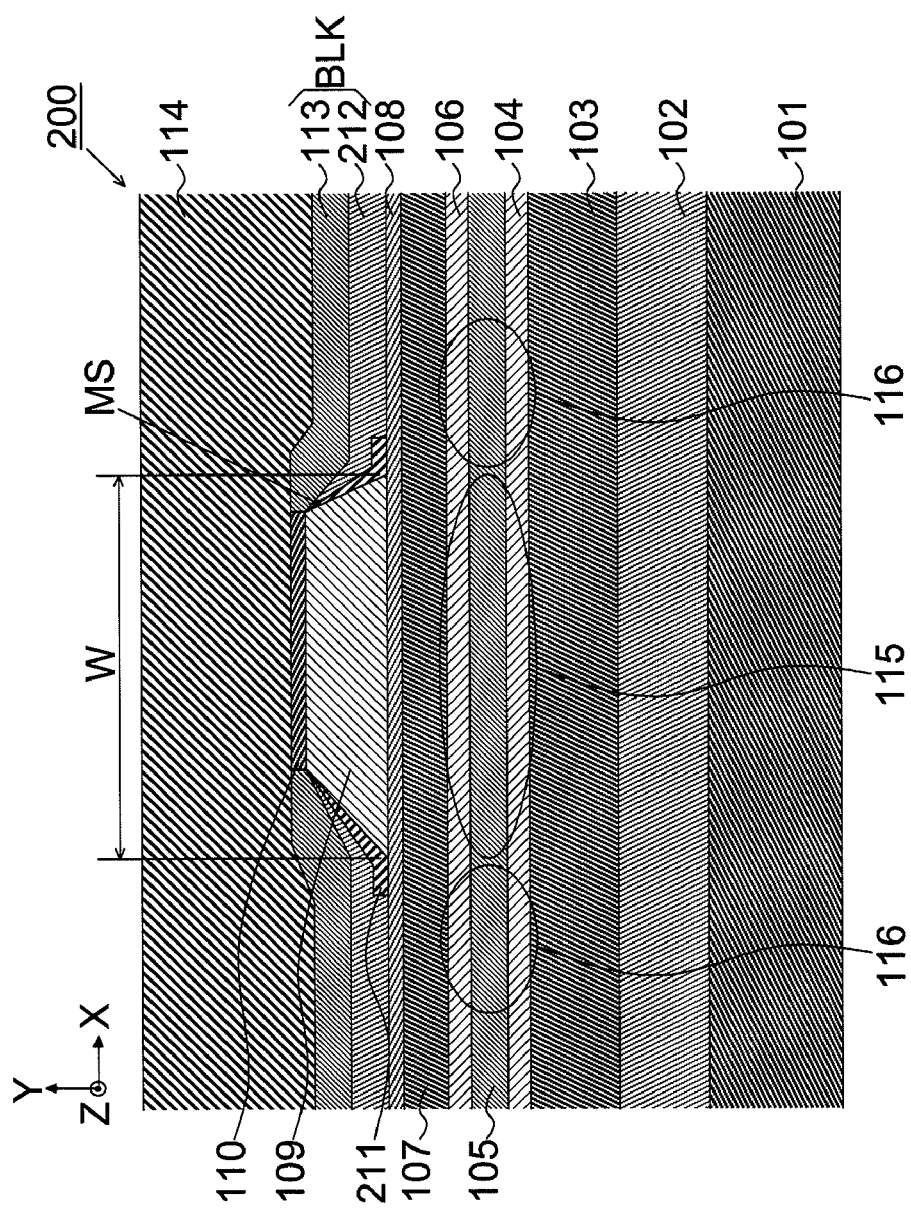
FIG. 3 illustrates a schematically cross-sectional view of a semiconductor laser according to a second exemplary embodiment of the present invention.

Next, a semiconductor laser according to a second exemplary embodiment of the present invention will be explained below. FIG. 3 illustrates a schematically cross-sectional view of the semiconductor laser according to the second exemplary embodiment of the present invention. In FIG. 3, the same symbols as the first exemplary embodiment are attached to the same elements as the first exemplary embodiment in FIG. 1.

In the first exemplary embodiment, the high-order mode filter layer is formed on the whole surface of the etching stopper layer except a region forming the second upper cladding layer, whereas, in a semiconductor laser 200 according to this exemplary embodiment, a high-order mode filter layer 211 is formed on both side faces of the second upper cladding layer 109 and on a part of the etching stopper layer 108 so as to extend from the side faces of the second upper cladding layer 109 to the etching stopper layer 108 continuously. The block layer BLK is formed on a region where the high-order mode filter layer 211 is not formed.

A multilayered structure of the semiconductor laser according to the second exemplary embodiment may adopt the structures showing in the first and second examples according to the first exemplary embodiment. Different points from the first exemplary embodiment are that the high-order mode filter layer 211 may be formed so as to extend from the lower part (bottom end) of the second upper cladding layer 109 forward both end faces (of the laser device) by, e.g., 100 nm on the etching stopper layer 108 and that the lower block layer 212 may be formed on the etching stopper layer 108 in a region where the second upper cladding layer 109 and high-order mode filter layer 211 are not formed.

In the first and second examples according to the second exemplary embodiment, there is a difference Δn between an equivalent refractive index in the X direction of a region corresponding to the second upper cladding layer 109 and that of a region corresponding to the region where the high-order mode filter layer 211 is not formed. According to the structure indicated in the above first example, the difference Δn between the equivalent refractive indexes in the X direction becomes about $3.0 \times 10^{-3}$.

According to the second exemplary embodiment, it is possible to decrease the loss in the waveguide restraining the high-order mode light because the high-order mode filter layer is limited to the vicinity of both side faces (and bottom ends thereof) of the mesa structure. The second exemplary embodiment can achieve the same effect as the first exemplary embodiment.

Modes other than the above modes according to the second exemplary embodiment are the same as the first exemplary embodiment, and explanation thereof is omitted herein.

Figure 4:
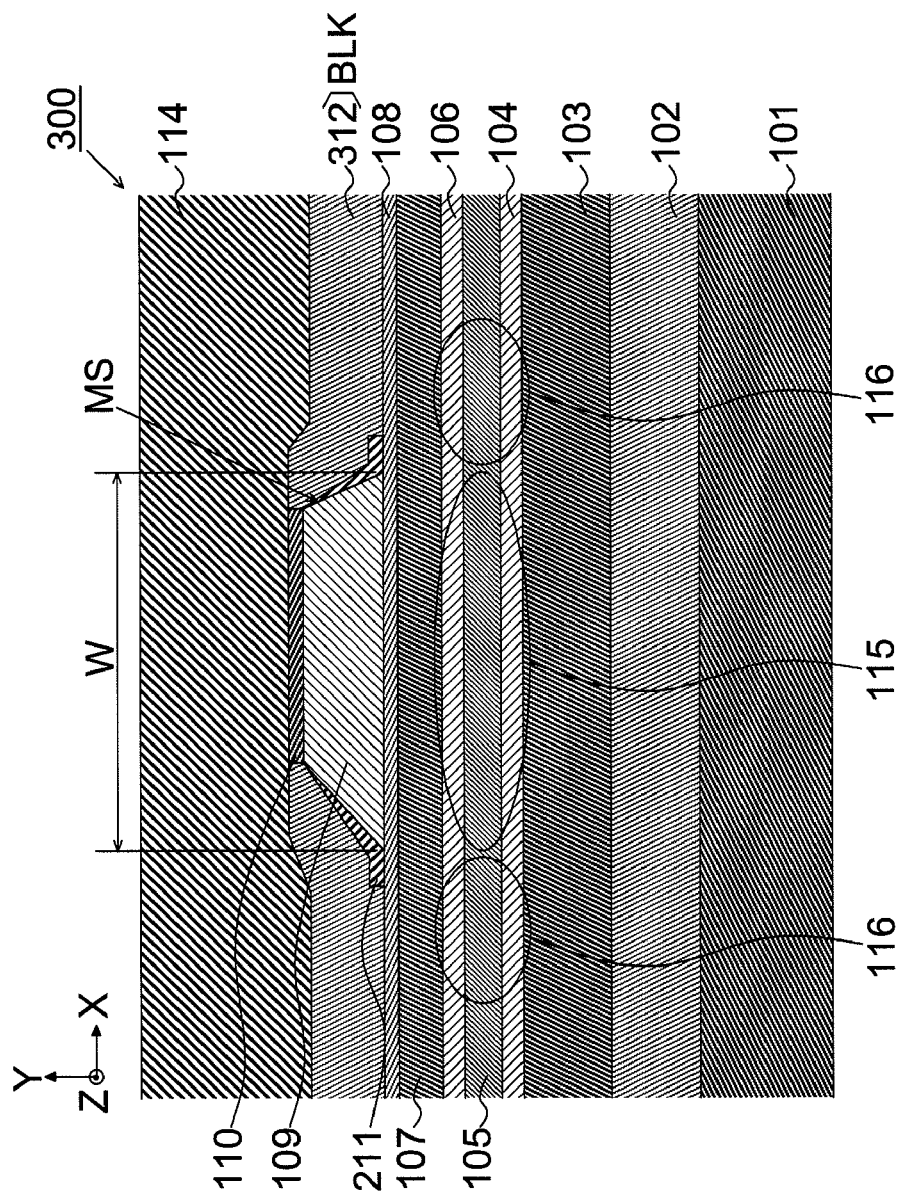
FIG. 4 illustrates a schematically cross-sectional view of a semiconductor laser according to a third exemplary embodiment of the present invention.

Next, a semiconductor laser according to a third exemplary embodiment of the present invention will be explained below. FIG. 4 illustrates a schematically cross-sectional view of a semiconductor laser according to the third exemplary embodiment of the present invention. In FIG. 4, the same symbols as the first and second exemplary embodiments are assigned to the same elements as the first and second exemplary embodiments in FIGS. 1 and 3.

In the first and second exemplary embodiments, the block layer has two layers, whereas, in a semiconductor laser 300 according to the third exemplary embodiment, a block layer 312 has only one layer having a band gap greater than that of the active layer 105. In the third exemplary embodiment, the block layer BLK does not include the layer corresponding to the upper block layer according to the first and second exemplary embodiments but has only a layer corresponding to the lower block layer according to the first and second exemplary embodiments.

An example of a multilayered structure of the semiconductor laser according to the third exemplary embodiment will be explained based on the first and second examples according to the first and second exemplary embodiments. The block layer 312 may be formed of an n type or undoped $(Al_xGa_{1-x})_{0.5}In_{0.5}P$ layer (thickness 1000 nm; impurity concentration $3 \times 10^{18}$ cm$^{-3}$). A structure other than the block layer may adopt the structures illustrating the first and second examples according to the first and second exemplary embodiments.

The third exemplary embodiment can achieve the same effect as the first exemplary embodiment.

Modes other than the above mode according to the third exemplary embodiment are the same as the first and second exemplary embodiments, and explanation thereof is omitted herein.

Figure 5:
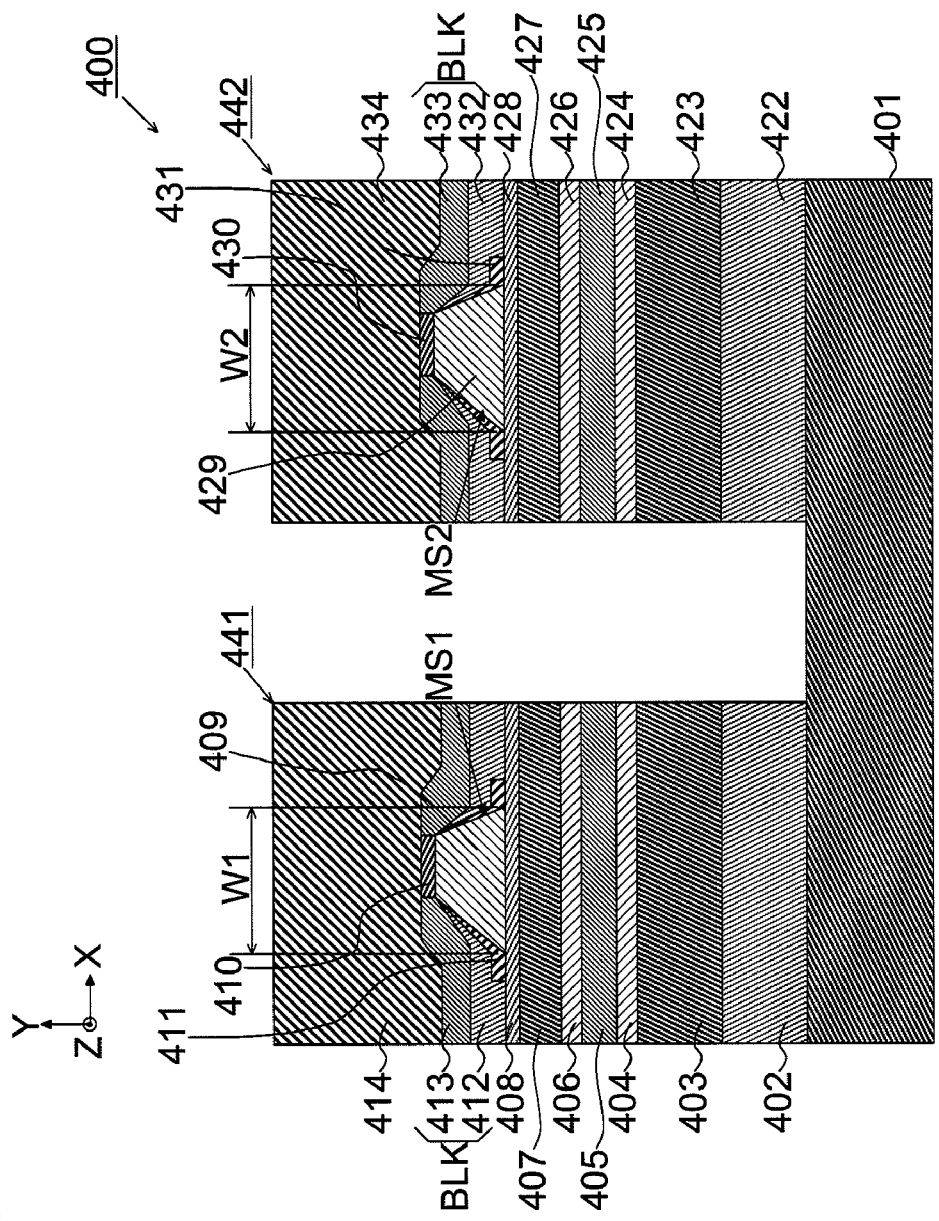
FIG. 5 illustrates a schematically cross-sectional view of a semiconductor laser according to a fourth exemplary embodiment of the present invention.

Next, a semiconductor laser according to a fourth exemplary embodiment of the present invention will be explained below. FIG. 5 illustrates a schematically cross-sectional view of the semiconductor laser according to the fourth exemplary embodiment of the present invention.

A semiconductor laser 400 according to the fourth exemplary embodiment has a plurality of light sources 441, 442 having different emission wavelengths from each other. Two light sources 441, 442 are monolithically assembled on a semiconductor substrate 401. Each light source is structured in the same manner as the first to third exemplary embodiments. In the mode illustrating in FIG. 5, the light sources 441, 442 have the structure according to the second exemplary embodiment. On the semiconductor substrate 401, buffer layers 402, 422, lower cladding layers 403, 423, lower guide layers 404, 424, active layers 405, 425, upper guide layers 406, 426, first upper cladding layers 407, 427, etching stopper layers 408, 428, second upper cladding layers 409, 429, cap layers 410, 430, high-order mode filter layers 411, 431, lower block layers 412, 432, upper block layers 413, 433 and contact layers 414, 434 are layered in both light sources.

A first example of the multilayered structure of the semiconductor laser according to the fourth exemplary embodiment will be indicated below. The layers 402-414 in the first light source 441 may have the structure as shown in the first example according to the second exemplary embodiment, and the layers 422-434 in the second light source 442 may have the structure as shown in the second example according to the second exemplary embodiment. In this mode, the emission wavelength of the first light source 441 is about 650 nm, and the emission wavelength of the second light source 442 is about 780 nm.

Widths W1, W2 of bottoms of a mesa structure MS1 of the first light source 441 and a mesa structure MS2 of the second light source 442 in the X direction may be, for example, 3.5 μm and 4.0 μm, respectively. A difference Δn in the effective refractive index of the first light source 441 (emission wavelength 650 nm) becomes about $3.0 \times 10^{-3}$, and that of the second light source 442 (emission wavelength 780 nm) becomes about $3.0 \times 10^{-3}$, for example.

Next, a second example of the multilayered structure of the semiconductor laser according to the fourth exemplary embodiment will be explained below. The layers 402-414 in the first light source 441 may have the structure as shown in the first example according to the second exemplary embodiment, and the layers 422-434 in the second light source 442 may have the following structure.

Buffer Layer 422: n Type GaAs; Thickness 675 nm; Impurity Concentration $5 \times 10^{17}$ cm$^{-3}$ Lower Cladding Layer 423: n Type AlGaAs (x=0.65); Thickness 1200 nm; Impurity Concentration $1 \times 10^{18}$ cm$^{-3}$ Lower Guide Layer 424: AlGaAs (x=0.4); Thickness 5 nm Active Layer 425 (Well Layer): AlGaAs (x=0.04); Thickness 4.5 nm Active Layer 425(Barrier Layer): AlGaAs (x=0.4); Thickness 5.0 nm Upper Guide Layer 426: AlGaAs (x=0.4); Thickness 5 nm First Upper Cladding Layer 427: p Type AlGaAs (x=0.65); Thickness 250 nm; Impurity Concentration $5 \times 10^{17}$ cm$^{-3}$ Etching Stopper Layer 428: p Type AlGaAs (x=0.2); Thickness 10 nm; Impurity Concentration $6 \times 10^{17}$ cm$^{-3}$ Second Upper Cladding Layer 429: p Type AlGaInP (x=0.7); Thickness 1000 nm; Impurity Concentration $6 \times 10^{17}$ cm$^{-3}$;

Cap Layer 430: p Type GaAs; Thickness 300 nm; Impurity Concentration $1.5 \times 10^{18}$ cm$^{-3}$ High-Order Mode Filter Layer 431: n Type or Undoped GaAs Layer or GaInP Layer; Thickness 10 nm (on Etching Stopper Layer 428), Width from Second Upper Cladding Layer 429 100 nm Block Layer BLK (Lower Block Layer 432): n Type or Undoped $(Al_xGa_{1-x})_{0.5}In_{0.5}P$ Layer (in case of x=1, AlInP Layer); Thickness 150 nm, Block Layer BLK (Upper Block Layer 433): n Type GaAs Layer; Thickness 850 nm; Impurity Concentration $3 \times 10^{18}$ cm$^{-3}$ Contact Layer 434: p Type GaAs; Thickness 3000 nm; Impurity Concentration $2 \times 10^{18}$ cm$^{-3}$ In the first example according to the fourth exemplary embodiment, a material of the second upper cladding layer 409 in the first light source 441 is different from that of the second upper cladding layer 429 in the second light source 442, whereas, in the second example, the material of the second upper cladding layer 409 in the first light source 441 is the same as that of the second upper cladding layer 429 in the second light source 442. According to the second example, simultaneous formation of two second upper cladding layers 409, 429 can be achieved more easily.

The fourth exemplary embodiment can achieve the same effect as the first exemplary embodiment.

Modes other than the above mode according to the fourth exemplary embodiment are the same as the first and second exemplary embodiments, and explanation thereof is omitted herein.

A process of manufacturing the semiconductor laser of the present invention will be explained below. An example of the process of manufacturing the semiconductor laser of the present invention will be explained below based on the process of manufacturing the semiconductor laser according to the second exemplary embodiment. FIGS. 6A-8B illustrate schematically flow charts to explain the process of manufacturing the semiconductor laser according to the second exemplary embodiment.

Figure 6A:
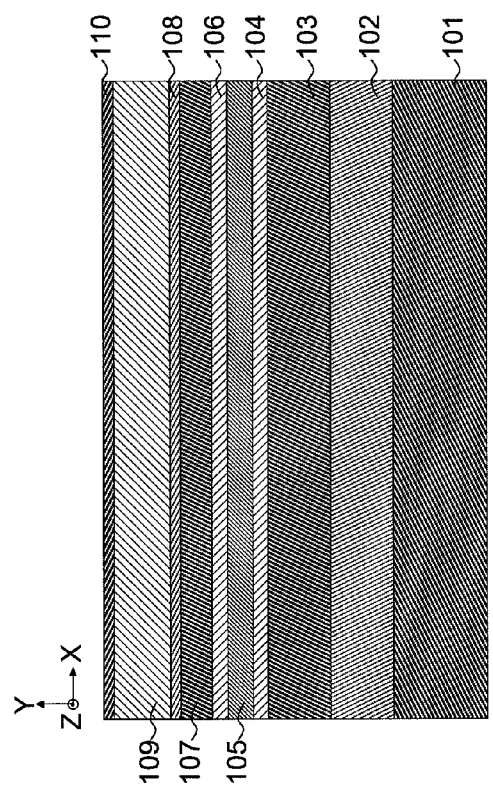
FIGS. 6A and 6B illustrate schematically flow charts to explain a process of manufacturing a semiconductor laser according to the second exemplary embodiment of the present invention.

On the semiconductor substrate 101, the buffer layer 102, lower cladding layer 103, lower guide layer 104, active layer 105, upper guide layer 106, first upper cladding layer 107, etching stopper layer 108, second upper cladding layer 109 and cap layer 110 are layered by epitaxial growth (FIG. 6A).

Figure 6B:
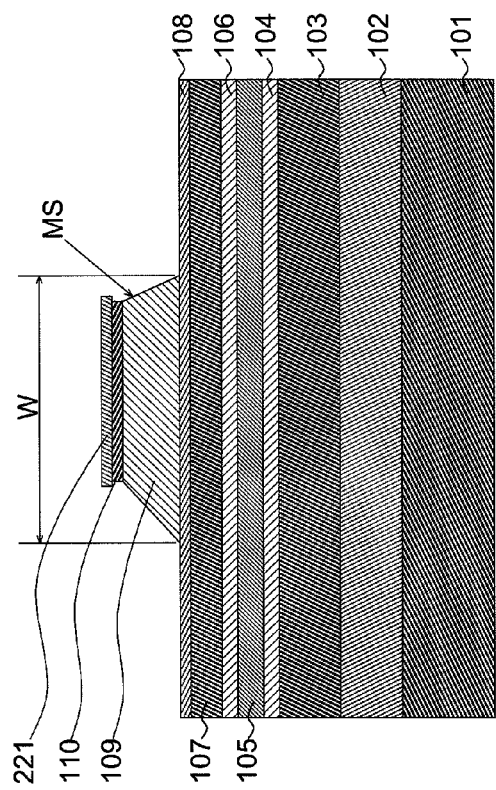

Next, by thermal chemical vapor deposition, photolithography and etching with hydrofluoric acid, a mask 221 (SiO$_2$ coating, for example) is formed on a predetermined region of the cap layer 110. Next, the second upper cladding layer 109 is wet-etched with a mask 221, until the etching stopper layer 108 is exposed, to form the second upper cladding layer 109 having the mesa structure MS (FIG. 6B). The mesa structure may be formed by a combination of dry etching and wet etching.

Next, by selective epitaxial growth, the high-order mode filter layer 211 is formed on both side faces of the mesa structure MS and on the exposed surface of the etching stopper layer 108 (FIG. 7A). Next, by the photolithography, a part of the high-order mode filter layer 211 on both end face sides is wet-etched to form the high-order mode filter layer 211 continuously extending from both side faces of the mesa structure MS to a part of the etching stopper layer 108 (FIG. 7B).

Next, after a resist (not shown) for the photolithography is removed, the block layer BLK is formed by the selective epitaxial growth with the mask 221 so as to cover the exposed surfaces of the high-order mode filter layer 211 and etching stopper layer 108. In the mode illustrated in FIGS. 8A and 8B, after the lower block layer 212 is formed, the upper block layer 113 is formed thereon (FIG. 8A).

Next, after the mask 221 is removed, the contact layer 114 is formed on the cap layer and the upper block layer 113 by the epitaxial growth (FIG. 8B).

Next, on both sides, a p side electrode and n side electrode made of Ti/Pt/Au, for example, are formed (not shown) and alloyed at a temperature of about 450° C., for example. Next, an element having a desired length and width is cut out. Lastly, coating having a desired reflectance is formed on a front end face (light emitting face) and back end face of the laser device (not shown).

According to the above process, a surface of the multi-quantum well active layer 105 is not exposed to an atmosphere. As a result, at the surface of the multi-quantum well active layer 105, a dark effect (i.e. non-light-emitting center) is prevented from being formed. Therefore, the self-pulsating oscillation is restrained from being weakened because of an insufficiency of the gain of the multi-quantum well active layer 105 itself. The life of the element is prolonged because the actuation current becomes lower.

Although the above process is explained based on the example of the semiconductor laser according to the second exemplary embodiment, the semiconductor lasers according to the first and third exemplary embodiments may be manufactured by a similar process, and therefore explanation of a detailed process thereof is omitted herein.

Figure 9A:
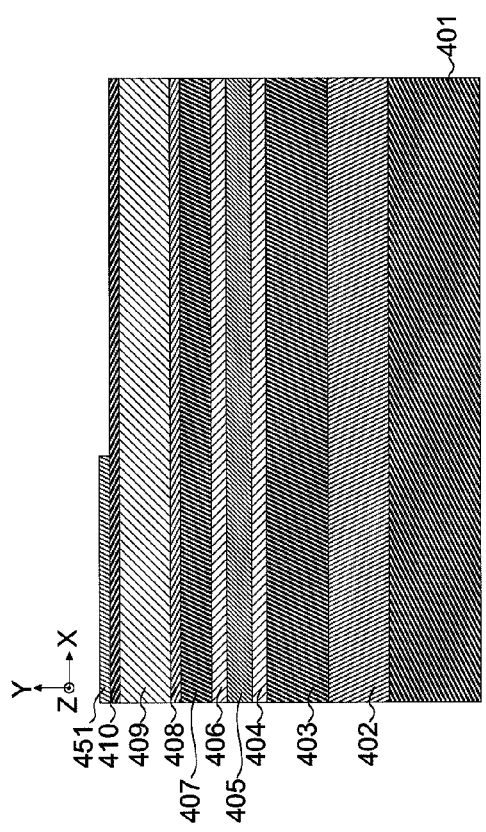
FIGS. 9A and 9B illustrate schematically flow charts to explain a process of manufacturing a semiconductor laser according to a fourth exemplary embodiment of the present invention.
Figure 9B:
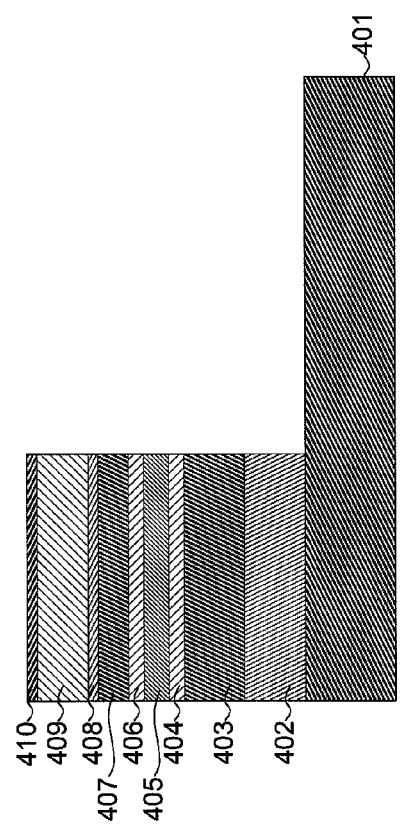

Next, a process of manufacturing the semiconductor laser according to the fourth exemplary embodiment of the present invention will be explained below. FIGS. 9A-11B illustrate schematically flow charts to explain the process of manufacturing the semiconductor laser according to the fourth exemplary embodiment of the present invention illustrated in FIG. 5. On the semiconductor substrate 401, the semiconductor layers 402-410 are formed. Next, on a region to form the first light source 441, a mask 451 (SiO$_2$ coating, for example) is formed by the photolithography (FIG. 9A). Next, a part of the semiconductor layers 402-410, which is in the region other than the first light source, is removed by the wet-etching or dry etching with the mask 451 to form the semiconductor multilayered structure which is a foundation of the first light source (FIG. 9B).

Next, after the mask 451 is removed, the semiconductor layers 422-430 which are a foundation of the second light source are layered. The semiconductor layers 422-430 are formed so as to cover the whole surface of the semiconductor substrate 401 and the semiconductor multilayered structure of the first light source 441 (FIG. 10A). The thicknesses of the buffer layer 422 and lower cladding layer 423 are suitably adjusted such that the height of an emission point of the first light source agrees with that of the second light source. As a result, the distance between the semiconductor substrate 401 and the active layer 405 of the first light source 441 is substantially equal to the distance between the semiconductor substrate 401 and the active layer 425 of the second light source 442. Next, on a region to form the second light source, a mask 452 is formed by the photolithography. Next, by the wet-etching or dry-etching with the mask 452, a part of semi-conductor layers 422-230, which is in the region other than the second light source 442, is removed to form the semiconductor multilayered structure which is the foundation of the second light source 442 (FIG. 10B). a part of semiconductor layers 422-430, which is in the region other than the second light source 442, is selectively removed by, for example, controlling the etching time and using an etching stopper layer (not shown). The order to form the semiconductor multilayered structures of the first light source 441 and second light source 442 may be reversed.

Figure 11A:
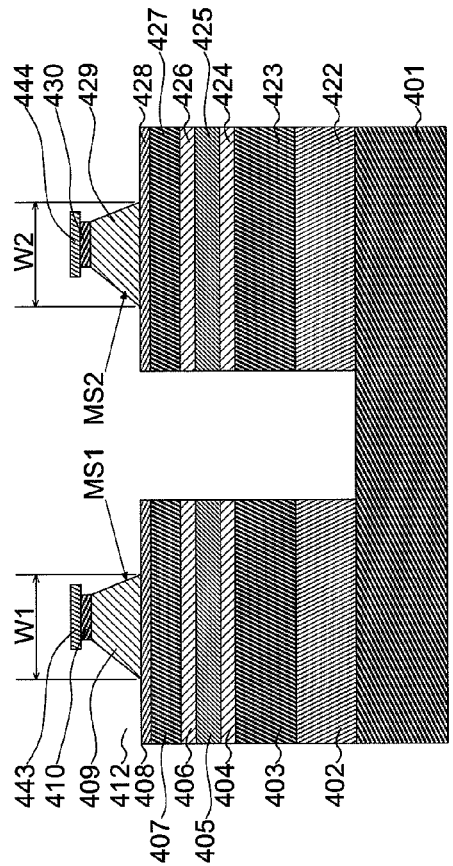
FIGS. 11A and 11B illustrate schematically flow charts to explain a process of manufacturing a semiconductor laser according to the fourth exemplary embodiment of the present invention.
Figure 11B:
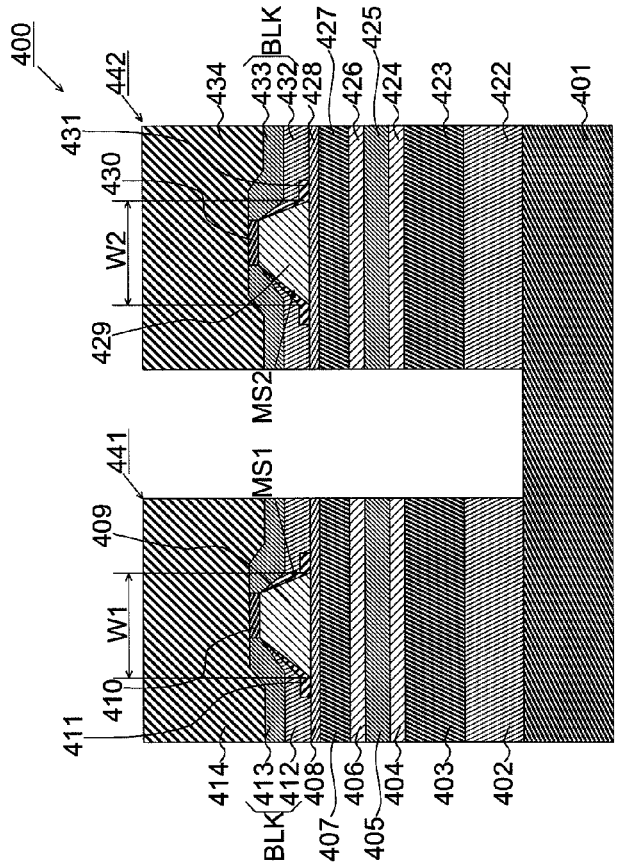

Next, in the same way as the above process of manufacturing the semiconductor laser according to the second exemplary embodiment, the etching stopper layers 408, 428 and the second upper cladding layers 409, 429 having the mesa structure MS are formed (FIG. 11A). The mesa structures MS1, MS2 of the first and second light sources 441, 442 may be formed simultaneously. Next, in the same way as the above process of manufacturing the semiconductor laser according to the second exemplary embodiment, the cap layers 410, 430, the high-order mode filter layers 411, 431, and the block layers 412, 413, 432, 433 are formed to manufacture the semiconductor laser 400 according to the fourth exemplary embodiment (FIG. 11B). The first light source 441 and second light source 442 having different emission wavelengths from each other are formed on the semiconductor substrate 401 in a monolithic manner.

Example 1

A temperature dependence of the actuation current required for the optical output of 4 mW in the semiconductor laser of the present invention was measured. The semiconductor laser used for the measurement was the semiconductor laser having the structure of the first example according to the second exemplary embodiment. As a comparison example, the measurement was also performed in a semiconductor laser having a block layer of only an n type GaAs layer. Measured results are shown in FIG. 12.

Figure 12:
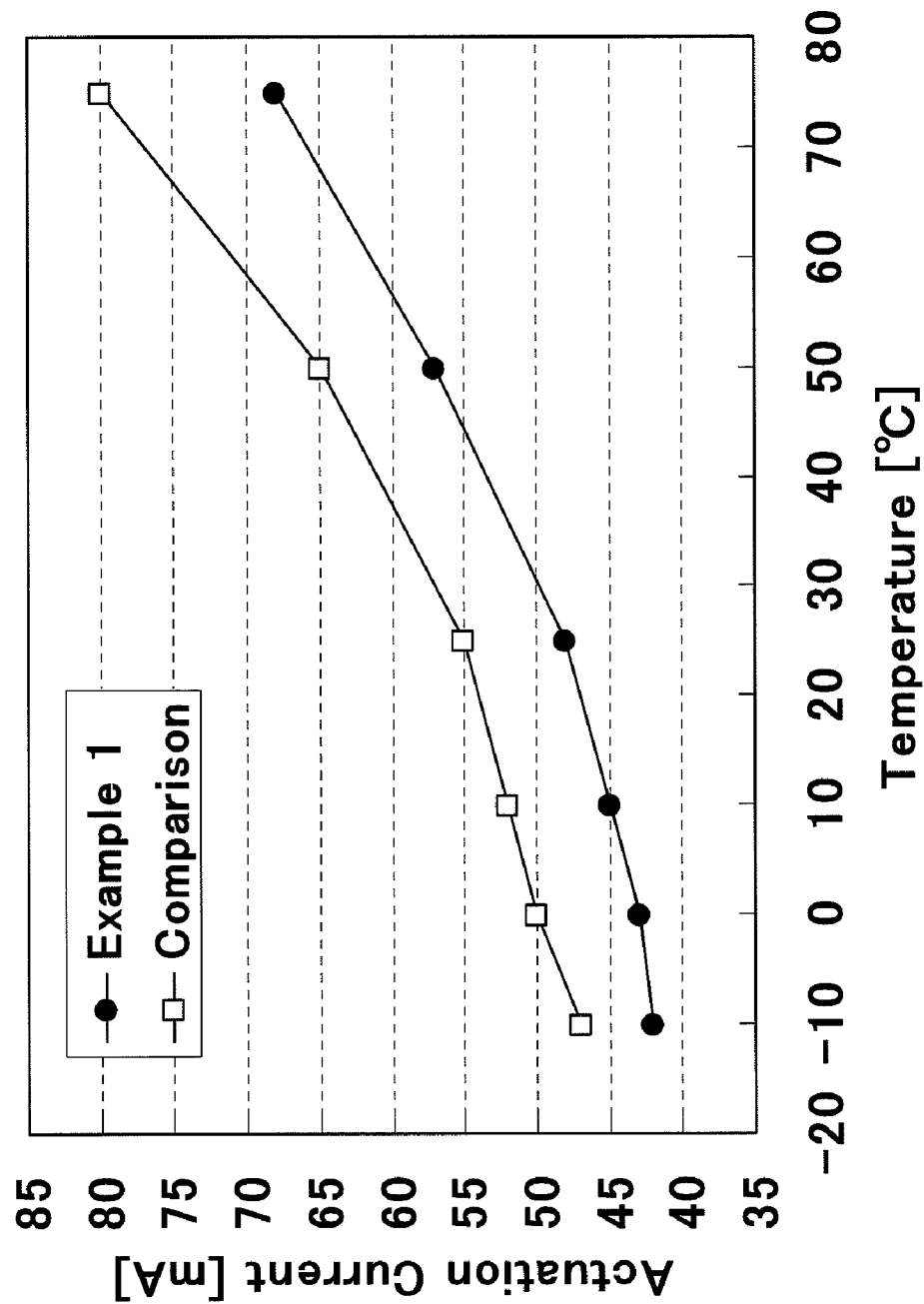
FIG. 12 is a graph showing a measurement result in example 1.

As shown in FIG. 12, the actuation current of the semiconductor laser of the present invention is lower than that of the semiconductor laser according to the comparison example under any temperature condition. This means that the loss in the waveguide of the semiconductor laser of the present invention is decreased as compared with the semiconductor laser according to the comparison example and that the lowering of the threshold current and improvement in the slope efficiency are achieved. According to the present invention, the performance and long-term reliability are enhanced because the actuation current is one of the important factors to determine the long-term reliability of the element. Because of the difference in the carrier overflow which becomes more conspicuous under the higher temperatures, the effect becomes more conspicuous under the higher temperature condition because higher the temperature becomes, greater the difference in the actuation current becomes.

Example 2

Figure 13:
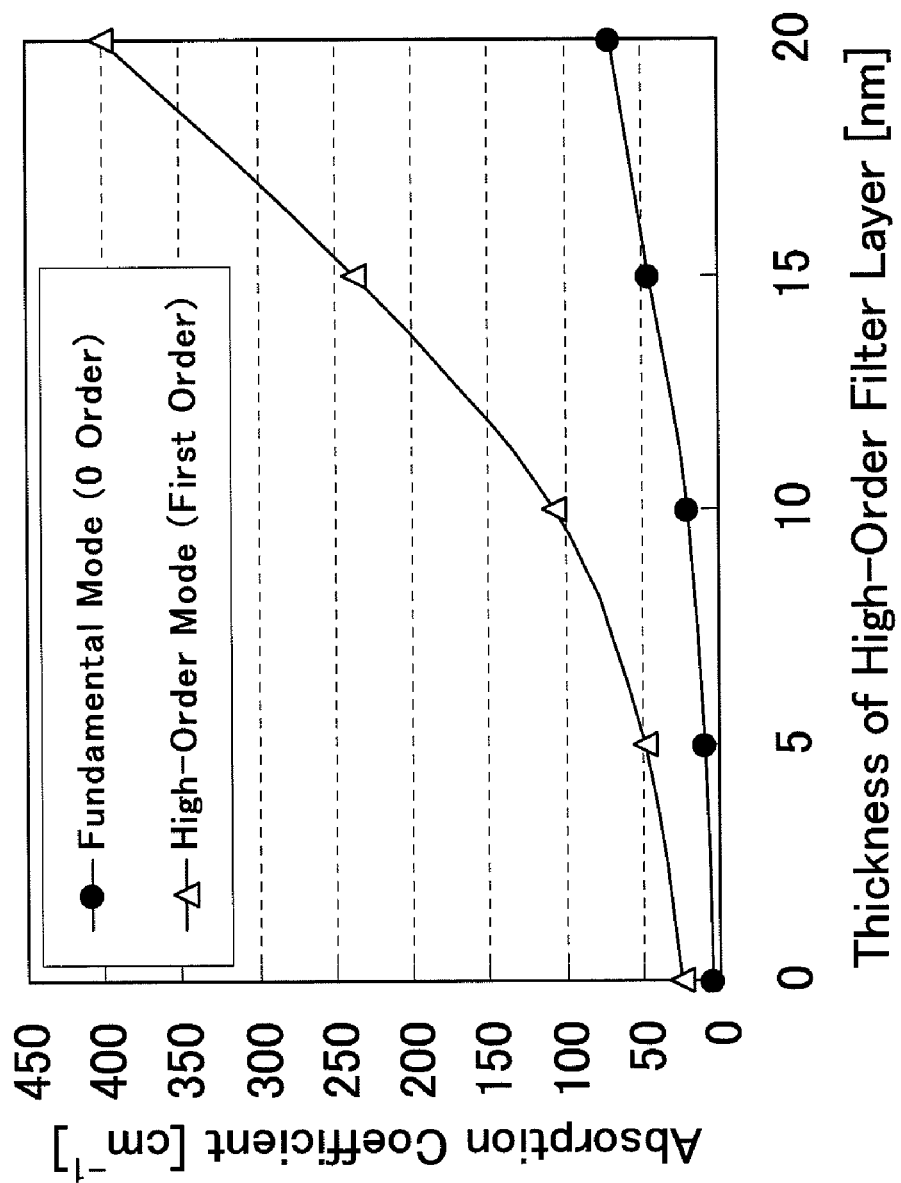
FIG. 13 is a graph showing a measurement result in example 2.

An optical loss of the horizontal transverse mode to the thickness of the high-order mode filter layer in the semiconductor laser of the present invention was measured. To be concrete, in the semiconductor laser having the structure of the first example according to the second exemplary embodiment, a thickness dependence of the high-order mode filter layer (GaAs layer) was inspected for the optical losses of the fundamental mode and high-order mode (first-order mode) determined by the waveguide structure. Measured results are shown in FIG. 13. The thickness of the high-order mode filter layer shown in abscissa of the graph in FIG. 13 represents the thickness on the side face of the second upper cladding layer and on the etching stopper layer.

As shown in FIG. 13, the thicker the high-order mode filter layer becomes, the greater becomes the difference between the optical loss of the fundamental mode and that of the high-order mode. This means that the difference between the threshold gain from just after start of the oscillation of the fundamental mode and that of the high-order mode increases as the high-order mode filter layer becomes thicker. Other experiments variously changing the temperature or parameters other than the high-order mode filter layer were performed, and similar results were obtained (not shown).

On the other hand, according to the result in FIG. 13, the loss in the fundamental mode slightly increases as the high-order mode filter layer becomes thicker. This impedes the lowering of the threshold current, the improvement of the slope efficiency and the lowering of the actuation current, which are the effects of the block layer including the lower block layer (AlInP layer) having the band gap larger than that of the active layer. Therefore, the thickness of the high-order mode filter layer and the length of the high-order mode filter layer from the side face of the mesa structure MS should be optimized corresponding to the desired ranges of the optical output and the temperature.

Although the present invention is explained by way of the GaInP/AlGaInP type and the GaAs/AlGaAs type as the examples, the present invention may be applied to the self-pulsating semiconductor laser of an InGaAsP/InP type, a GaN type, a ZnSe type and so on.

Although the semiconductor laser and manufacturing process thereof of the prevent invention are explained based on the above exemplary embodiments, the present invention is not limited to the above exemplary embodiments, and may include any modification, change and improvement to the exemplary embodiment within the scope of the present invention. Within the scope of the present invention, various combinations, displacements and selections of disclosed elements are available.

It should be noted that other objects, characteristics and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor laser comprising:
a semiconductor substrate;
a lower cladding layer disposed above said semiconductor substrate;
an active layer disposed above said lower cladding layer;
a first upper cladding layer disposed above said active layer;
a second upper cladding layer disposed above said first upper cladding layer and having a mesa structure;
a high-order mode filter layer formed on both side faces of said second upper cladding layer, continuously extending from said both side faces onto at least a part of a side region on both side regions of said second upper cladding layer and having a band gap not exceeding a band gap of said active layer; and
a block layer formed on said high-order mode filter layer and on the regions of both side regions of said second upper cladding layer, said block layer including a layer having a band gap greater than the band gap of said active layer,
wherein said high-order mode filter layer includes a GaInP layer.

2. The semiconductor laser according to claim 1, wherein the high-order mode filter layer continuously extends from both side faces of said mesa structure to both end faces.

3. The semiconductor laser according to claim 1, wherein said active layer has a saturable absorption region formed on both sides of a gain region.

4. A semiconductor laser comprising:
a semiconductor substrate;
a lower cladding layer disposed above said semiconductor substrate;
an active layer disposed above said lower cladding layer;
a first upper cladding layer disposed above said active layer;
a second upper cladding layer disposed above said first upper cladding layer and having a mesa structure;
a high-order mode filter layer formed on both side faces of said second upper cladding layer, continuously extending from said both side faces onto at least a part of a side region on both side regions of said second upper cladding layer and having a band gap not exceeding a band gap of said active layer; and a block layer formed on said high-order mode filter layer and on the regions of both side regions of said second upper cladding layer, said block layer including a layer having a band gap greater than the band gap of said active layer, wherein said block layer includes an $(Al_xGa_{1-x})_{0.5}In_5P$ layer, wherein $0 \leqq x \leqq 1.0$.

5. A semiconductor laser comprising:

a semiconductor substrate;

a lower cladding layer disposed above said semiconductor substrate;

an active layer disposed above said lower cladding layer;

a first upper cladding layer disposed above said active layer;

a second upper cladding layer disposed above said first upper cladding layer and having a mesa structure;

a high-order mode filter layer formed on both side faces of said second upper cladding layer, continuously extending from said both side faces onto at least a part of a side region on both side regions of said second upper cladding layer and having a band gap not exceeding a band gap of said active layer; and a block layer formed on said high-order mode filter layer and on the regions of both side regions of said second upper cladding layer, said block layer including a layer having a band gap greater than the band gap of said active layer, wherein said block layer includes an $(Al_xGa_{1-x})_{0.5}In_5P$ layer, wherein $0 \leqq x \leqq 1.0$, and a GaAs layer.

6. The semiconductor laser according to claim 5, wherein the GaAs layer is formed on the $(Al_xGa1-x)0.5In0.5P$ layer.

7. A semiconductor laser comprising:

a semiconductor substrate;

a lower cladding layer disposed above said semiconductor substrate;

an active layer disposed above said lower cladding layer;

a first upper cladding layer disposed above said active layer;

a second upper cladding layer disposed above said first upper cladding layer and having a mesa structure;

a high-order mode filter layer formed on both side faces of said second upper cladding layer, continuously extending from said both side faces onto at least a part of a side region on both side regions of said second upper cladding layer and having a band gap not exceeding a band gap of said active layer;

a block layer formed on said high-order mode filter layer and on the regions of both side regions of said second upper cladding layer, said block layer including a layer having a band gap greater than the band gap of said active layer;

a first light source and second light source, having different oscillation wavelengths from each other, on said semiconductor substrate, wherein each of said first light source and second light source has said lower cladding layer, said active layer, said first upper cladding layer, said second upper cladding layer, said high-order mode filter layer and said block layer.

8. The semiconductor laser according to claim 7, wherein a material of said second upper cladding layer of said first light source is the same as a material of said second upper cladding layer of said second light source.

9. The semiconductor laser according to claim 7, wherein a material of said active layer of said first light source is different from a material of said active layer of said second light source.

* * * * *

UNITED STATES PATENT AND TRADEMARK OFFICE
CERTIFICATE OF CORRECTION

PATENT NO. : 8,111,728 B2  Page 1 of 1
APPLICATION NO. : 12/618277
DATED : February 7, 2012
INVENTOR(S) : Kobayashi It is certified that error appears in the above-identified patent and that said Letters Patent is hereby corrected as shown below:

In the Claims

Column 19, Line 8: Claim 4, delete "$(Al_xGa_{1-x})_{0.5}In_5P$" and insert -- $(Al_xGa_{1-x})_{0.5}In_{.5}P$ --

Column 19, Line 8: Claim 5, delete "$(Al_xGa_{1-x})_{0.5}In_5P$" and insert -- $(Al_xGa_{1-x})_{0.5}In_{.5}P$ --

Column 19, Line 8: Claim 6, delete "$(Al_xGa1-x)0.5In5P$" and insert -- $(Al_xGa_{1-x})_{0.5}In_{0.5}P$ --

Signed and Sealed this
Sixteenth Day of September, 2014

Michelle K. Lee
*Deputy Director of the United States Patent and Trademark Office*

UNITED STATES PATENT AND TRADEMARK OFFICE
CERTIFICATE OF CORRECTION

PATENT NO.         : 8,111,728 B2                                    Page 1 of 1
APPLICATION NO.    : 12/618277
DATED              : February 7, 2012
INVENTOR(S)        : Kobayashi It is certified that error appears in the above-identified patent and that said Letters Patent is hereby corrected as shown below:

In the Claims

Column 19, Line 8: Claim 4, delete "$(Al_xGa_{1-x})_{0.5}In_5P$" and insert -- $(Al_xGa_{1-x})_{0.5}In_{.5}P$ --

Column 19, Line 28: Claim 5, delete "$(Al_xGa_{1-x})_{0.5}In_5P$" and insert -- $(Al_xGa_{1-x})_{0.5}In_{.5}P$ --

Column 19, Line 31: Claim 6, delete "$(Al_xGa1-x)0.5In5P$" and insert -- $(Al_xGa_{1-x})_{0.5}In_{0.5}P$ --

This certificate supersedes the Certificate of Correction issued September 16, 2014.

Signed and Sealed this
Seventh Day of October, 2014

Michelle K. Lee
*Deputy Director of the United States Patent and Trademark Office*